(12) United States Patent
Sonsky et al.

(10) Patent No.: US 8,389,392 B2
(45) Date of Patent: Mar. 5, 2013

(54) FINFET WITH SEPARATE GATES AND METHOD FOR FABRICATING A FINFET WITH SEPARATE GATES

(75) Inventors: Jan Sonsky, Leuven (BE); Radu Surdeanu, Roosbeek (BE)

(73) Assignee: NXP B.V., Eindhoven (NL)

( * ) Notice: Subject to any disclaimer, the term of this patent is extended or adjusted under 35 U.S.C. 154(b) by 246 days.

(21) Appl. No.: 12/866,852

(22) PCT Filed: Feb. 9, 2009

(86) PCT No.: PCT/IB2009/050506
§ 371 (c)(1),
(2), (4) Date: Aug. 9, 2010

(87) PCT Pub. No.: WO2009/101564
PCT Pub. Date: Aug. 20, 2009

(65) Prior Publication Data
US 2010/0314684 A1 Dec. 16, 2010

(30) Foreign Application Priority Data
Feb. 11, 2008 (EP) .................................... 08101457

(51) Int. Cl.
*H01L 21/3205* (2006.01)
(52) U.S. Cl. ........ 438/586; 438/157; 438/176; 438/195; 438/230; 438/283; 257/E21.561
(58) Field of Classification Search ................... 438/157, 438/176, 195, 230, 283, 284, 586; 257/E21.561
See application file for complete search history.

(56) References Cited

U.S. PATENT DOCUMENTS

| 6,433,609 B1 | 8/2002 | Voldman |
| 6,611,029 B1 | 8/2003 | Ahmed et al. |
| 6,800,885 B1 | 10/2004 | An et al. |

(Continued)

FOREIGN PATENT DOCUMENTS

| WO | 2005/038930 A2 | 4/2005 |
| WO | 2006/122956 A1 | 11/2006 |
| WO | 2007093930 A1 | 8/2007 |

OTHER PUBLICATIONS

Yongxun, Liu, et al; "Cointegration of High-Performance Tied-Gate Three-Terminal Finfets and Variable Threshold-Voltage Independent—Gate Four-Terminal Finfets With Asymmetric Gate-Oxide Thickness"; IEEE Electron Device Letters, IEEE Service Center, New York, NY, US, Vol. 28, No. 6; p. 517-519 (Jun. 1, 2007).

(Continued)

*Primary Examiner* — Matthew Reames

(57) ABSTRACT

The present invention relates to a FinFET with separate gates and to a method for fabricating the same. A dielectric gate-separation layer between first and second gate electrodes has an extension in a direction pointing from a first to a second gate layer that is smaller than a lateral extension of the fin between its opposite lateral faces. This structure corresponds with a processing method that starts from a covered basic FinFET structure with a continuous first gate layer, and proceeds to remove parts of the first gate layer and of a first gate-isolation layer through a contact opening to the gate layer. Subsequently, a replacement gate-isolation layer that at the same time forms the gate separation layer fabricated, followed by filling the tunnel with a replacement gate layer and a metal filling.

9 Claims, 10 Drawing Sheets

U.S. PATENT DOCUMENTS

| | | |
|---|---|---|
| 6,911,697 B1 | 6/2005 | Wang et al. |
| 2005/0124120 A1 | 6/2005 | Du et al. |
| 2005/0145954 A1 | 7/2005 | Zhu et al. |
| 2005/0275040 A1 | 12/2005 | Anderson et al. |
| 2006/0202266 A1 | 9/2006 | Radosavljevic et al. |
| 2007/0029623 A1 | 2/2007 | Liu et al. |
| 2007/0181930 A1 | 8/2007 | Zhu et al. |

OTHER PUBLICATIONS

Harrison, S., et al; "Poly-Gate Replacement Through Contact Hole (PRETCH): A New Method for High-K/Metal Gate and Multi Oxide Implementation on Chip"; IEDM 2004 Proceeding ; 4 pages (2004).

Coronel, P., et al; "Highly Performant Double Gate Mosfet Realized With Son Process How We Address the Design and Process for the GAA SON Challenges?"; 2004 IEEE International Conference on Integrated Circuit Design & Tech; p. 81-89 (2004).

Cerutti, R., et al; Metal-Gate All-Around CMOS Integration Using Poly-Gate Replacement Through Contact Hole (PRETCH); 2005 IEEE International Conference on Integrated Circuit & Technology; p. 203-206 (2005).

International Search Report and Written Opinion for Application PCT/IB2009/050506 (Feb. 9, 2009).

FINFET WITH SEPARATE GATES AND METHOD FOR FABRICATING A FINFET WITH SEPARATE GATES

FIELD OF THE INVENTION

The present invention relates to a FinFET with separate gates and to a method for fabricating a FinFET with separate gates. It also relates to an integrated circuit comprising a FinFET and to a method for making the same.

BACKGROUND OF THE INVENTION

A FinFET is a transistor architecture of the metal-oxide-semiconductor field-effect transistor (MOSFET) type, which is favored as a replacement for planar MOSFET transistors in future integrated circuits fabricated in MOS technology, such as NMOS, PMOS, CMOS or BiCMOS.

A FinFET comprises a gate structure, which is wrapped around three sides of a fin-shaped channel region that stands vertically on a substrate surface. The substrate surface is assumed as being oriented horizontally for the purpose of this description. In contrast to planar MOSFET transistors, which have a channel region in parallel orientation to the substrate surface, FinFETs allow superior channel charge control even at extremely short gate lengths.

Although FinFETs are considered double-gate MOSFET structures, the two gates of a FinFET are often physically and electrically connected. In contrast, U.S. Pat. No. 6,611,029 B1 discloses a FinFET that has separate gates. The gates are arranged on opposite lateral sides of the fin. A top fin face is covered by a dielectric layer that electrically insulates the two gates from each other.

FinFETs with separate gates share the additional advantages of planar MOSFETs with two independent gates. The gates can be addressed individually. For instance, a channel or gate biasing can be applied by controlling the voltage applied to one of the two gates in order to vary the transistor threshold voltage. The other gate, which is not used for threshold voltage adjustment, is used to switch the transistor and to drive current through the channel.

The fabrication of a FinFET with separate gates is not trivial. In U.S. Pat. No. 6,611,029 B1, the processing involves the use of a protective dielectric cap during an etching process for the formation of the fin on an originally buried oxide layer of the substrate. Subsequently, source and drain regions are formed adjacent to longitudinal ends of the fin. Then, a dielectric layer is thermally grown on the lateral faces of the fin. The dielectric layer forms the gate isolation layer. Subsequently, a gate material layer is deposited over the fin and then patterned by lithography, followed by planarizing the gate material in a chemical-mechanical polishing (CMP) treatment. The CMP treatment is performed such that the gate material is even with the dielectric cap in the vertical direction. This separates the gate material into two separate gate layers. The dielectric cap assumes the function of a gate separation layer in this step. The processing then continues with the formation of gate electrodes and other known steps.

Considering the small dimensions of the fin in current and future MOS technology nodes, this processing is not only very tedious but also very sensitive to process variations and misalignment. Furthermore, the integration of the FinFET processing of U.S. Pat. No. 6,611,029 B1 into conventional MOS processing schemes is very expensive.

In addition, the fabrication of a combination of a first type of FinFETs having two separated gates with a second type of FinFETs having a single continuous gate on a single wafer would be very costly on the basis of the method known from U.S. Pat. No. 6,611,029 B1. The CMP treatment that separates the gates into two gate layers affects the whole wafer and does not allow differentiating between the FinFETs of the first and second type. As a consequence, the FinFETs of the second type would either have to be fabricated separately after the FinFETs of the first type, or some kind of repair of the gate layer would have to be selectively performed on the FinFETs of the second type, which would require special efforts to avoid extensive defect formation in the gate stack and thus poor device performance.

Furthermore, the mentioned prior art does not address a situation, in which different gate-electrode materials are needed, e.g. for NMOS and PMOS transistors. The CMP process may be particularly sensitive to one, but not the other.

It would therefore be desirable to provide an alternative FinFET structure with separate gates and a method for fabricating a FinFET with separate gates, which remove or mitigate these disadvantages.

SUMMARY OF THE INVENTION

The present invention has method and device aspects. In the following, the method aspect will be described first.

According to the first aspect of the invention, a method for fabricating a FinFET that has separate gates, comprises:
providing a substrate with a transistor structure that has a fin-shaped channel region, hereinafter called fin, standing on the substrate surface;
a gate stack, comprising a continuous first gate-isolation layer on mutually opposite lateral fin faces and on a top fin face, and a continuous first gate layer on the gate-isolation layer, the first gate layer continuing into a first contact section that, on a first lateral side with regard to the fin, laterally extends away from the fin on the substrate; and a cover layer covering the gate stack;
fabricating a first contact opening that extends through the cover layer to the contact section of the first gate layer;
selectively, with respect to at least the cover layer and the substrate, removing through the first contact opening the first gate layer in the contact section and at least on the adjacent lateral face of the fin, stopping the removal before reaching an onset of the opposite lateral fin face, thus forming a first tunnel having an end wall formed by an end face of remaining parts of the first gate layer;
depositing a second gate-isolation layer on the tunnel walls, thus also forming a gate-separation layer on the end wall of the first tunnel and covering the end face of the remaining parts of the first gate layer; and
fabricating a first gate electrode by filling the remaining volume of the first tunnel with electrically conductive material.

The method of the first aspect of the invention is based on the provision of a basic FinFET structure with a single continuous gate layer at the onset of the method. The basic FinFET structure has the fin-shaped channel region (herein called the fin), a continuous gate stack on three sides of the fin and a cover layer on top.

The processing for fabricating a FinFET with separate gates starts from this basic structure and involves the fabrication of a contact opening that in the method of the invention is advantageously used as an access opening to the continuous first gate layer on one lateral side of the fin. A tunnel is then formed in the structure by controlled removal of sections of the first gate layer through this access opening. This removal step defines the position of a gate separation layer, which is fabricated in a subsequent step. Namely, the refilling of the tunnel begins with the introduction of the gate separation layer, which at the same time forms a second gate isolation layer. The first gate layer is therefore a sacrificial layer in the parts that are removed. It can be a fully sacrificial layer in other embodiments, which will be described further below.

The method of the invention provides a processing module that fits well to existing processing technologies. The module can be inserted after finishing the fabrication of the basic FinFET structure and before starting the back end processing.

The method of the present invention also has the advantage of being sufficiently insensitive to process variations and misalignments. It exhibits a sufficient tolerance regarding the lateral positioning of the contact opening with respect to the fin and regarding the precision of the positioning of the end face of the remaining parts of the first gate layer in the removal step. The method of the first aspect of the invention thus provides a surprisingly simple technology to manufacture FinFETs with separate gates.

In the following, embodiments of the method of the first aspect of the invention will be described. The additional features of these embodiments can be combined to form further embodiments unless they are described as forming alternatives to each other.

For the purpose of definition, the term gate electrode and gate are both used as synonyms in the present application, with a meaning that comprises a combined structure of a gate layer and a contact layer. The gate layer and the contact layer are in alternative embodiments made of different or identical materials. The term gate stack is used for the combination of the gate electrode with the gate-isolation layer.

Regarding the use of the term "lateral" in this application, the two mutually opposite lateral fin faces have surface vectors, which each point into a respective one of two opposite directions which are perpendicular to a direction pointing from source to drain. A lateral direction is a direction parallel to one of the mentioned surface vectors. A lateral side of the fin refers to a region in space extending from a respective fin face substantially in the direction of its surface vector.

In one embodiment, separate gate contacts allowing a separate addressing of the two gate layers are made by providing the gate stack with a modified first gate layer, which additionally continues into a second contact section that, on a second lateral side with regard to the fin, laterally extends away from the fin on the substrate. The second lateral side is opposite to the first lateral side. By way of example and without limitation, the first lateral side can be the left side of the fin, as seen in a cross-section perpendicular to the current direction in the channel region of the FinFET. The second lateral side then is the right side of the fin in this view.

On the second lateral side, a contact structure to the second contact section of the first gate layer is fabricated in this embodiment, preferably after the further processing of the method of the invention. The contact structure is then preferably made by fabricating a second contact opening that extends through the cover layer to the second contact section of the first gate layer. The second contact opening can for instance be prepared in a masked anisotropic etching step. Subsequently, the contact opening is filled with a suitable electrically conductive material, such as tungsten.

In an alternative embodiment, instead of filling the contact opening immediately as just described, the processing of the invention applied on the first lateral side of the fin is repeated in an analogous manner for the second lateral side of the fin. Thus, the method further comprises after the fabrication the second contact opening:

selectively, with respect to at least the cover layer, the substrate and the second gate-isolation layer, removing through the second contact opening the first gate layer in the second contact section and at least on the adjacent lateral face of the fin, stopping the removal with reaching the gate-separation layer, thus forming a second tunnel having an end wall formed by the exposed face of the gate separation layer;

depositing a third gate-isolation layer at least on side walls of the second tunnel; and fabricating a second gate electrode, which is isolated from the first gate electrode by the gate-separation layer, by filling the second tunnel with electrically conductive material on the third gate isolation layer.

By this additional processing, which is optional and not required for implementing the invention, the extension of the gate-separation layer between the first and second gate layers in the finalized FinFET can be approximately doubled in comparison with a processing that only performs the gate separation by performing the processing on only one lateral side of the fin, if the third gate-isolation layer is also deposited on the end wall of the second tunnel, which is formed by the gate separation layer fabricated before.

The advantages of a FinFET structure with two separated gate electrodes will be addressed later in the context of the description of the device aspect of the invention.

In an embodiment that replaces the first gate layer on both lateral sides of the fin, the choice of the material of the first gate layer can be made without any regard to the desired electrical conductivity of the deposited material, if no FinFETs with a continuous gate are desired on the same wafer. For the first gate layer is a fully sacrificial layer in this embodiment. It is advantageous to select the material of the first gate layer so as to optimize the ease of processing during the tunnel formation.

No matter whether the removal of the first gate layer and the formation of a tunnel is performed on only one side of the fin or on both sides of the fin, there is a broad choice of electrically conductive gate-layer materials, including poly-silicon, multi-layer structures, containing, e.g., poly-Si and poly-SiGe, metals such as tungsten, silicided metal layers. In this respect, there is also the following advantage: since the initial (replacement) gate is made of a regular material (such as polysilicon), whose patterning and etching are very well known, very narrow gates can be formed. It may be difficult, time-consuming or even impossible to devise etching procedures to pattern gates made of unusual materials. Furthermore, according to the present invention, the final gate possibly using the unusual materials is fabricated just before the back-end-of-processing, which makes it easier to introduce unusual gate materials into the fabs in regard to, e.g., contamination issues.

Also with regard to the first through third gate-isolation layers, many known materials can be used, such as silicon dioxide, silicon oxynitride, high-K dielectrics such as $HfO_2$, $ZrO_2$ and combinations thereof, as well as laminate structures or other combinations of the mentioned materials.

Note that the replacement of the first gate layer on either one or both lateral sides of the fin allows using different materials and/or layer thicknesses in the gate stack for the two separate gates. The technological simplicity of the method of the invention is particularly evident in the fact that it does not require a dedicated process step development for providing different gate electrode materials and thickness. In one embodiment, the FinFET with separate gates is fabricated to have asymmetric performance parameters in the separate gates. For example, the left gate stack can be formed for low-power switching while the right gate stack is chosen for high-performance applications. High performance refers to high drive currents or to low input capacitance (RF applications), or a high gate voltage.

The removal of the first gate layer is preferably performed selectively also with respect to the first gate-isolation layer. This processing allows a subsequent separate removal of the first gate-isolation layer. This can be performed with exact control, thus improving the precision of the processing. The removal is typically performed by a selective etching step. However, where a suitable combination of materials and removal agents is available, the removal of the first gate-isolation layer can also be combined with that of the first gate layer in a single processing step.

The method according to the invention provides a particularly advantageous modular processing structure, which allows combining FinFETs with continuous gates and with separate gates on one chip, as will be described in more detail below. In such embodiments, FinFETs that are provided to keep their continuous gate stack need only be spared from the tunnel formation and from the deposition of the gate separation layer.

A second method aspect of the invention is thus formed by a method for fabricating an integrated circuit comprising a first type of FinFETs having separate gates and a second type of FinFETs having a single continuous gate. The method of this aspect of the invention comprises performing the method of the first aspect of the invention selectively only for those transistor structures on the substrate, which are provided for fabrication of FinFETs of the first type, and sparing the FinFETs of the second type from the processing according to the method of the first aspect of the invention. The method of the second method aspect of the invention increases the freedom of the design of integrated circuits by allowing an integration of FinFETs with separate and of FinFETs with continuous gates on a single wafer. This helps to optimize integrated circuits according to the needs of their specific applications.

In one embodiment, the method of the second aspect comprises, after the step of providing the preprocessed substrate, protecting those transistor structures provided for fabrication of FinFETSs of the second type so as to keep them unaffected by the process flow of the method either for the complete process flow or beginning at the latest with the selective removal of the first contact opening and ending at the earliest with the completion of the deposition of the second gate-isolation layer. The protection is preferably provided by suitably masking the cover layer in areas containing FinFETs of the second type.

A FinFet made according to the above method can have separate gates is provided. The FinFET comprises a fin-shaped channel region, herein fin, arranged between source and drain regions; first and second gate electrodes isolated from each other, each facing a respective one of two mutually opposite lateral fin faces; and a dielectric gate-separation layer between the first and second gate electrodes, which is configured to prevent a current flow between the first and second gate electrodes in operation of the FinFET. The gate-separation layer can have an extension in a direction pointing from the first to the second gate layer that is smaller than a lateral extension of the fin between its opposite lateral faces.

The FinFET has a structure that on one hand reflects and on the other hand enables the processing according to the method of the first aspect of the invention. The structure allows the use of a fabrication technology that forms the gate separation layer together with a second (replacement) gate-isolation layer only after the basic FinFET structure has been fabricated, by way of deposition of the mentioned second gate-isolation layer. It thus allows achieving the advantages of the methods of the first and second aspects of the invention and their embodiments.

The FinFET can be used to advantage in any IC application, which requires a (dynamic) threshold voltage adjustment or control. The FinFET is particularly suited for future ultra-low-power ICs.

The extension of the gate-separation layer between the first and second gate electrodes can be equal to a thickness of a gate-isolation layer between a first of the lateral fin faces and the adjacent gate electrode. This embodiment is particularly suitable for low-power applications. Since the gate-separation layer is equal to the thickness of the gate-isolation layer, the applicable voltage difference between the two gate electrodes is limited to the maximum allowed gate voltage that can be applied to the gate electrode associated with the gate-isolation layer. However, this does not limit the applicability of the FinFET because it represents the most useful way of operating the FinFET in practice anyway.

Alternatively, a higher voltage between the first and second gate layers can be applied where the processing of the first aspect of the invention is applied on both lateral sides of the fin. The extension of the gate-separation layer between the two gate electrodes can be equal to a sum of thicknesses of the gate-isolation layers, which are arranged between the lateral fin faces and the corresponding gate electrodes.

This case is particularly useful if an asymmetry between the gate is desired, and different thicknesses of the gate-isolation layers are present.

Asymmetry can also be achieved by choice of materials of the gate stacks. The first and second gate electrodes of one embodiment comprise a respective first and second gate stack, each with a respective gate isolation layer and a respective gate layer. The respective gate isolation layers and gate layers of the first and second gate stacks can be made of different materials.

In IC applications, the FinFET can comprise a substantially flat cover layer that forms a pre-metal dielectric layer burying the fin. In such embodiments, a dielectric layer of the same material as the gate-separation layer can be arranged between the first gate layer and the cover layer, or between the first and second gate layers and the cover layer. This reflects the processing of the invention, in which the dielectric layer can be deposited on the tunnel walls.

BRIEF DESCRIPTION OF THE DRAWINGS

These and other aspects of the invention will be apparent from and elucidated with reference to the embodiments described hereinafter. In the following drawings.

DETAILED DESCRIPTION OF EMBODIMENTS

Figure 1:
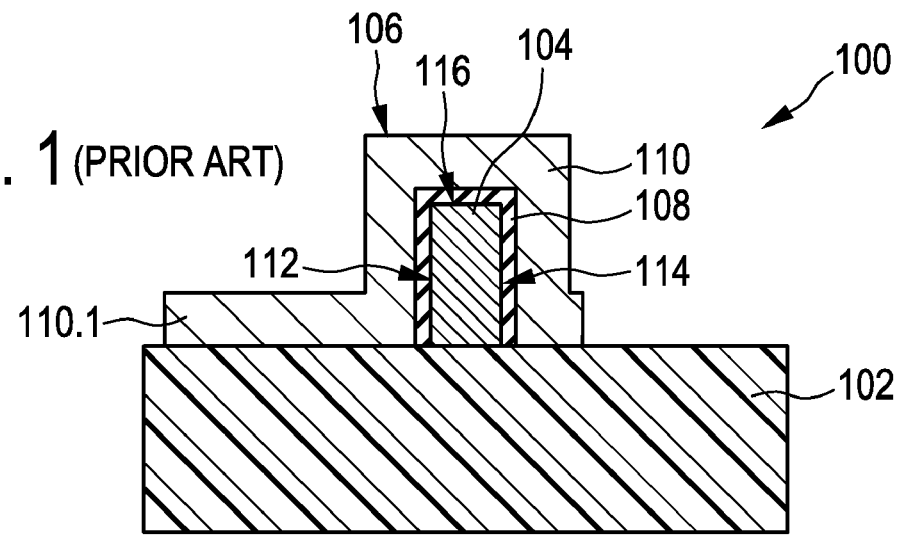
FIGS. 1 and 2 are a cross-sectional and top view of a FinFET with a single continuous gate according to the prior art.
Figure 2:
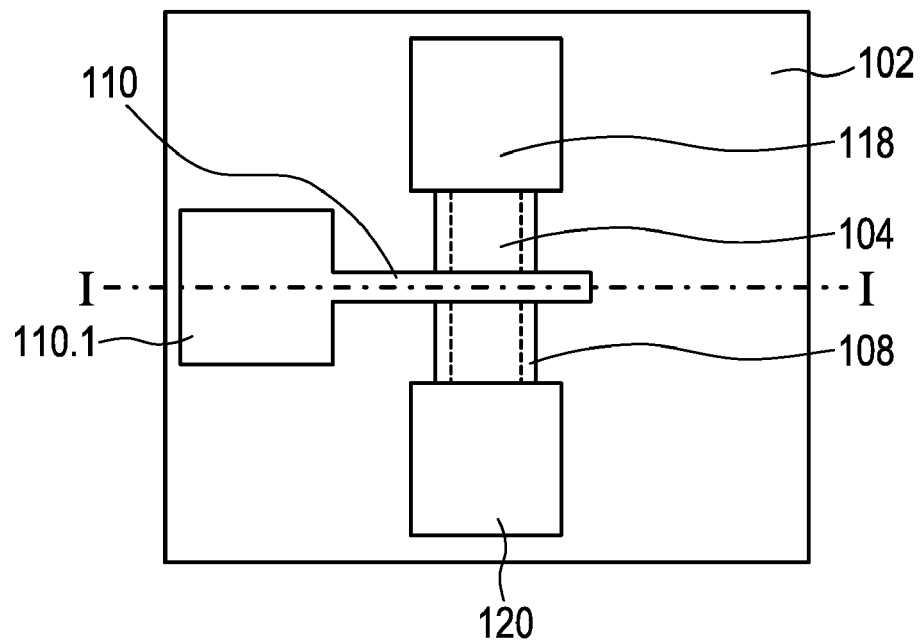

FIGS. 1 and 2 show a cross-sectional and a top view of a FinFET with a continuous gate stack according to the prior art. The cross-sectional view of FIG. 1 is taken along the broken line I-I in FIG. 2.

The FinFET structure 100 of the prior art is based on a substrate, typically a silicon-on-insulator (SOI) wafer. The FinFET structure builds on the originally buried insulator layer 102, which typically is made of silicon dioxide. At the processing stage shown in all the Figures, the surface silicon layer has been removed. A fin-shaped channel region 104, the fin of the FinFET 100, stands on a surface of the buried oxide layer 102. A gate stack 106 comprising a continuous first gate-isolation layer 108 and a continuous first gate layer 110 is arranged on the fin. The first gate-isolation layer 108 extends on mutually opposite lateral fin faces 112 and 114 and on a top fin face 116. The first gate layer 110 covers the first gate-isolation layer and laterally continues into a contact section 110.1 on the left side of the fin 104. The contact section 110.1 extends on the left lateral side of the fin, away from the fin on the buried oxide layer 102. As can be seen in the top view of FIG. 2, the contact section is approximately square-shaped to provide a large enough contact area.

The top view of FIG. 2 additionally reveals that the FinFET 100 has the fin 104 arranged between source and drain electrodes 118 and 120. In operation of the FinFET 100, current through the channel region under a given voltage between the source and drain electrodes 118 and 120 is controlled by a gate voltage applied via the gate layer 110, as is well known by the skilled person from the basics his or her electrical engineering experience.

Figure 3:
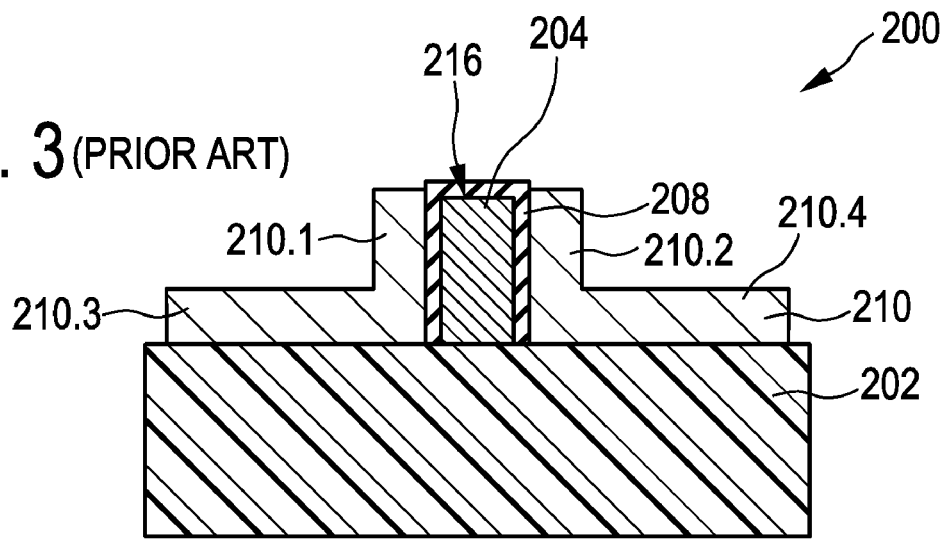
FIGS. 3 and 4 are a cross-sectional and top view of a FinFET with two separate gates according to the prior art.
Figure 4:
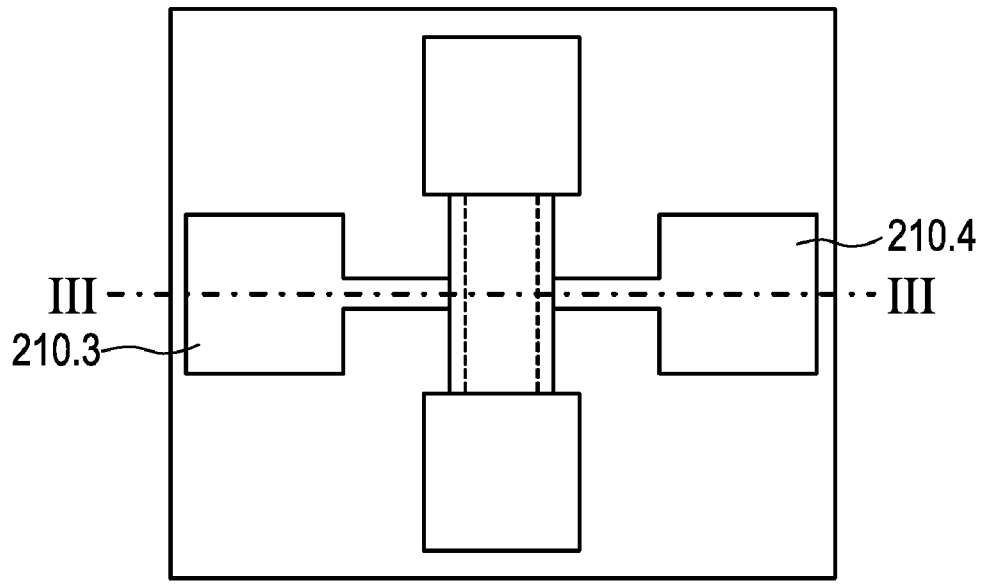
Figure 5:
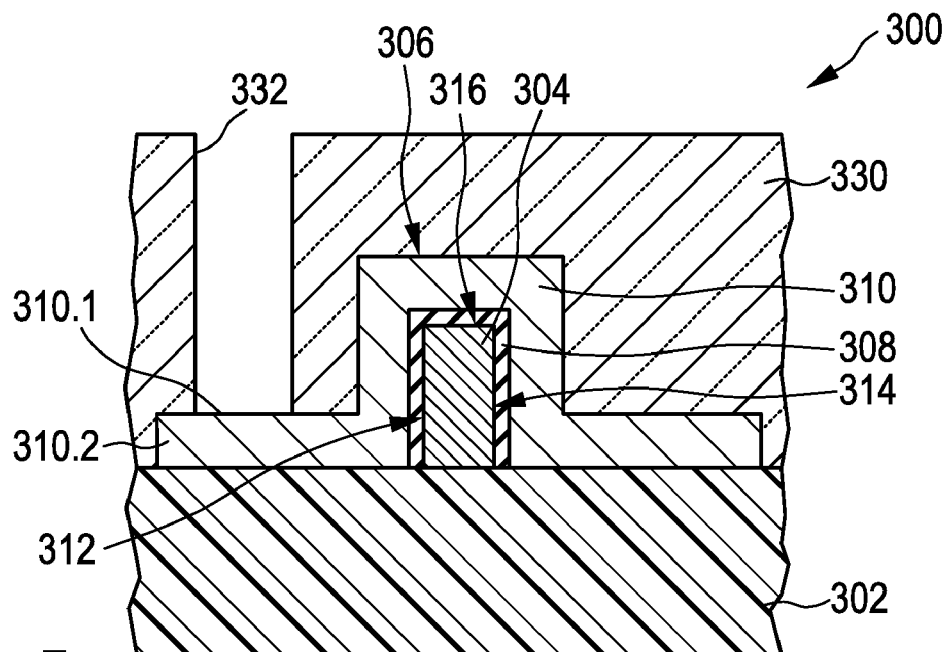
FIGS. 5 to 10 are cross-sectional views of a first embodiment of a FinFET according to the invention during different stages of its fabrication.

FIGS. 3 and 4 show a cross-sectional and top view of an alternative prior-art FinFET structure with two separate gates. The cross-sectional view of FIG. 3 is taken along the broken line III-III in FIG. 4.

In contrast to the FinFET 100 of FIGS. 1 and 2, the FinFET 200 of FIGS. 3 and 4 has two separate gates 210.1 and 210.2, which continue into first and second contact sections 210.3 and 210.4, respectively, on both lateral sides of the fin 204. The gate-isolation layer 208 separates the two gate layers 210.1 and 210.2 at the top face 216 of the fin. The top-section of the gate-isolation layer 208 thus forms a gate-separation layer at the same time. The extension of the gate-separation layer between the gate layers 210.1 and 210.2 equals the extension of the fin 204 between its opposite lateral fin faces. The top view of FIG. 4 very clearly shows the left and right contact sections 210.3 and 210.4 and the gate layers 210.1 and 210.2 separated by the gate isolation layer over the lateral extension of the fin.

Disadvantages of the FinFET structure 200 have been described in the introductory part of the present application with reference to the similar structure known from U.S. Pat. No. 6,611,029 B1.

FIGS. 5 to 10 show cross-sectionals view of an embodiment of a FinFET 300 according to an embodiment the invention during different stages of its fabrication. The processing according to the present embodiment of the method of the invention starts from a basic FinFET structure corresponding to the prior-art FinFET 100 of FIG. 1. At the processing stage shown, the FinFET 300 of FIG. 5 has a cover layer 330 on top of a basic FinFET structure corresponding that of FIG. 1.

In the present embodiment, the first gate layer 310 is made of polysilicon, while the first gate-isolation layer is made of silicon dioxide. Other materials can be used, which are known to be suitable gate-layer materials or gate-isolation materials, respectively. The cover layer is typically a pre-metal dielectric layer used in standard processing of integrated circuits. The cover layer 330 can for instance be made of silicon oxide.

Starting from this basic FinFET structure with a continuous gate stack 306, which comprises a continuous first gate-isolation layer 308 and a continuous first gate layer 310, a step of forming a contact opening 332 is performed. The contact opening can be fabricated by a standard fabrication step, for instance by using a masked anisotropic etching step. The finished contact opening extends through the cover layer 330 down to a surface 310.1 of the first gate layer 310 in a left contact region 310.2.

Figure 6:
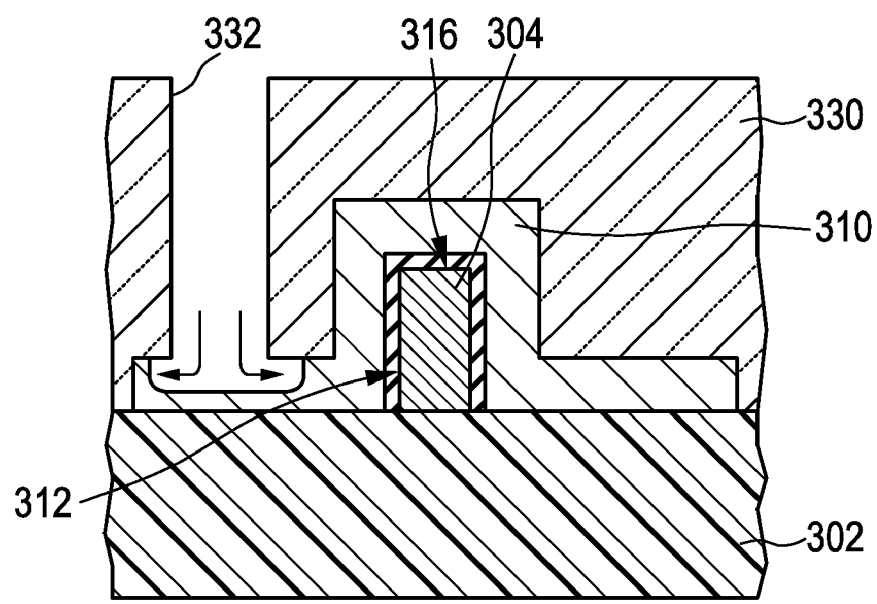
Figure 7:
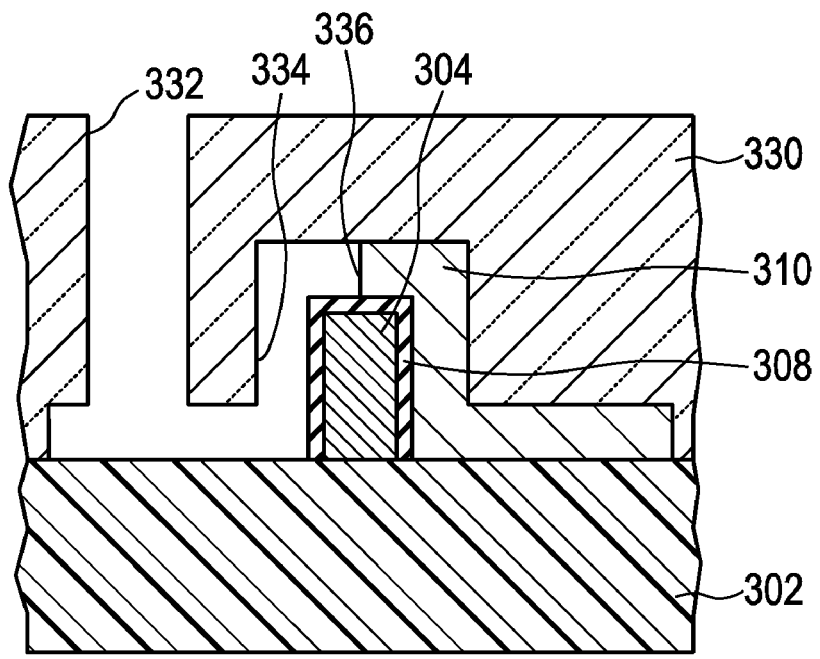

In a subsequent processing step, which is illustrated in FIGS. 6 and 7, isotropic etching of the first gate layer 310 is performed using the contact opening 332 as an access opening for the etching agent. The etching step is performed selectively with respect to the surrounding layers. Suitable wet etchants for this process are well known in the art. One suitable etching agent is hydrofluoric acid (HF) An alternative suitable etching process is dry reactive ion etching, e.g., SF6 based.

The removal of the first gate layer is continued in a controlled manner until the complete contact section 310.2 and the complete gate-layer section covering the left lateral side 312 of the fin are removed. The removal also continues half way through the top face 316 of the fin 304. Remaining parts 310.3 of the first gate layer 310 cover the right half of the fin 304, the right lateral side 314 of the fin, and extend away from the fin to the right side. The first gate-isolation layer 308, the cover layer 330 and the buried oxide layer 302 remain unaffected by this etching step.

This way, a tunnel 334 is formed that has sidewalls formed by the cover layer 330, the buried oxide layer 302, and the first gate-isolation layer 308. An end face 336 of the tunnel is formed by the end face of the remaining parts 310.3 of the first gate layer 310.

Figure 8:
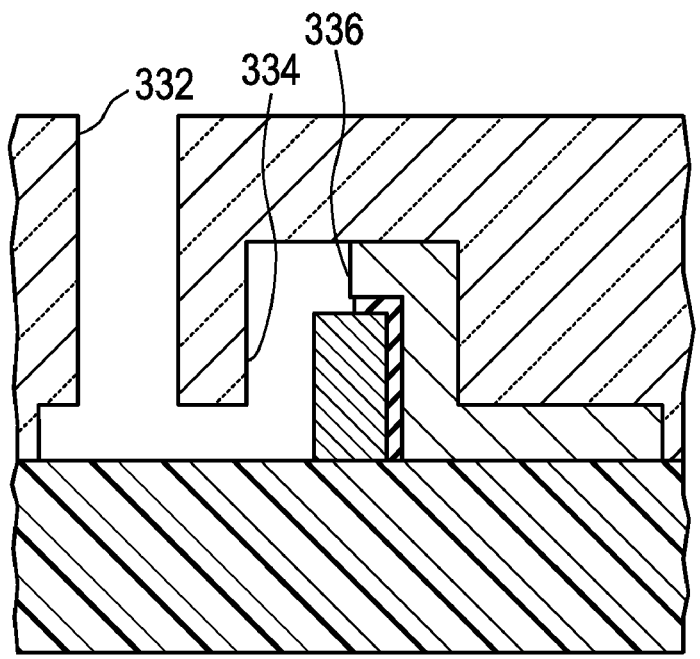

In a subsequent processing step, the result of which is shown in FIG. 8, the first gate-isolation layer is selectively removed with respect to the buried oxide layer the cover layer and the material of the fin, which is typically single-crystalline silicon Si or silicon-germanium SiGe.

Figure 9:
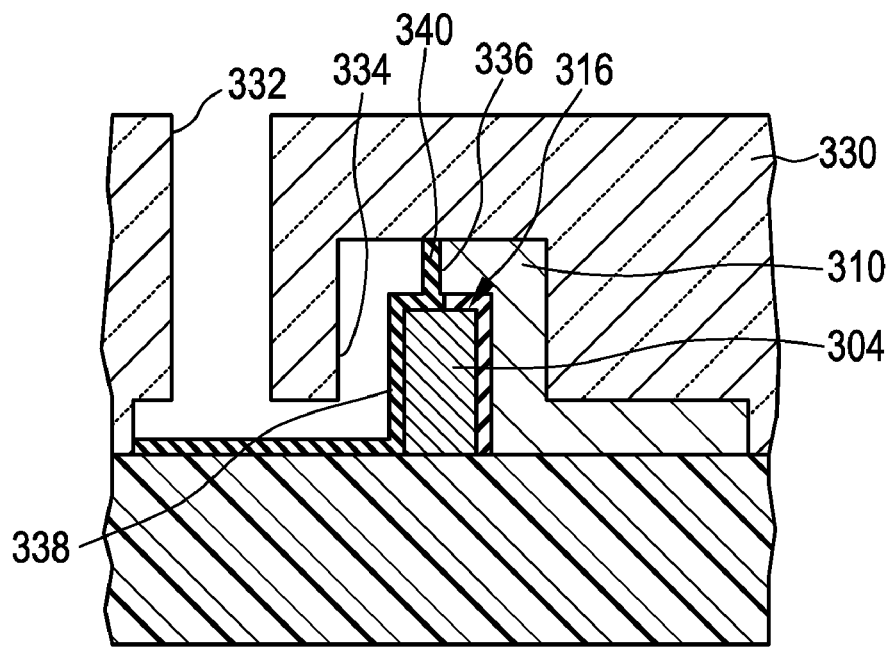

Subsequently, as shown in FIG. 9, a second gate-isolation layer is deposited on the tunnel walls and on the end face 336 of the tunnel 334. The second gate-isolation layer is deposited not only on the left face 312 of the fin 304 and the exposed section of the top face 316 of the fin 304. It also covers the sidewalls of the tunnel, which for reasons of graphical simplicity is not shown in FIG. 9.

In particular, an end section of the deposited second gate-isolation layer forms a gate-separation layer 340 on the end face 336 of the first gate layer 310. The thickness of the gate-separation layer 340 corresponds to that of the second gate-isolation layer 338 that covers the top and left faces 316 and 312 of the fin 304.

Many materials are suitable for deposition as the second gate-isolation layer 338 and the gate-separation layer 340. Again, silicon dioxide, silicon oxynitride or known high-K materials such as $HfO_2$ or $ZrO_2$ or composites of these materials can be used for instance.

Suitable deposition techniques for the second gate-isolation layer and the gate-separation layer are in particular Atomic Layer Chemical Vapor Deposition (ALCVD) techniques for their exceptionally good step coverage. Therefore, the deposition of the second gate-isolation layer and the gate-separation layer in the topographically complicated tunnel structure 334 is well controllable. So is a subsequent deposition of a second gate layer 342 in the tunnel. A suitable material for the second gate layer 342 is polysilicon. A suitable technique for depositing polysilicon in the tunnel 334 is chemical vapor deposition on the second-gate isolation layer 338 and on the gate-separation layer 340.

In some embodiments, the gate layer is not deposited to completely fill the tunnel 334, but only as a more or less thin layer covering the second gate-isolation layer 338 and the gate-separation layer 340. The remaining open volume of the tunnel 334 is then filled with a metal, such as tungsten W. This way, the transistor structure of the present embodiment is finished, except for a subsequent planarization treatment. The planarization treatment can be a CMP treatment, but alternatively also a simple dry reactive ion etching process to remove the metal from the top surface. The planarization treatment is not shown in the Figs.

Figure 10:
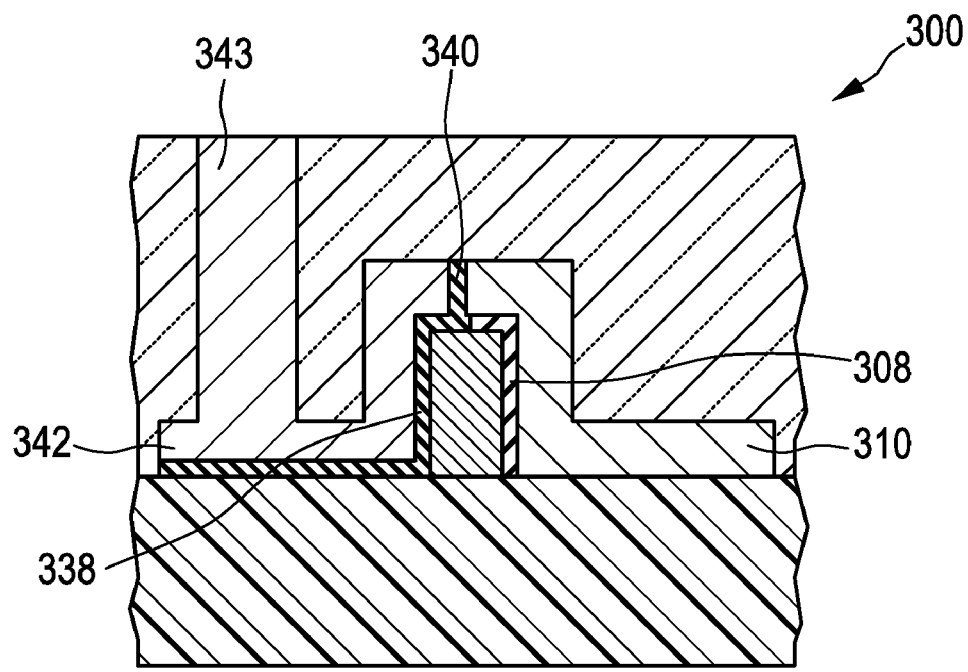

The FinFET structure 300 of FIG. 10 forms a FinFET with separate gate layers. Up to this stage, only one of the gate layers is contacted in the processing. In subsequent processing, a contact through the cover layer 330 can be fabricated to the right gate layer 310 as well, following standard procedures for fabricating a contact (and, preferably, simultaneously all other contacts, e.g. to source/drain or other structures. While this is advantageous for many application purposes, two separate gate electrodes are not a mandatory feature according to the invention. The FinFET can also be fabricated and/or operated with only a single gate.

Figure 11:
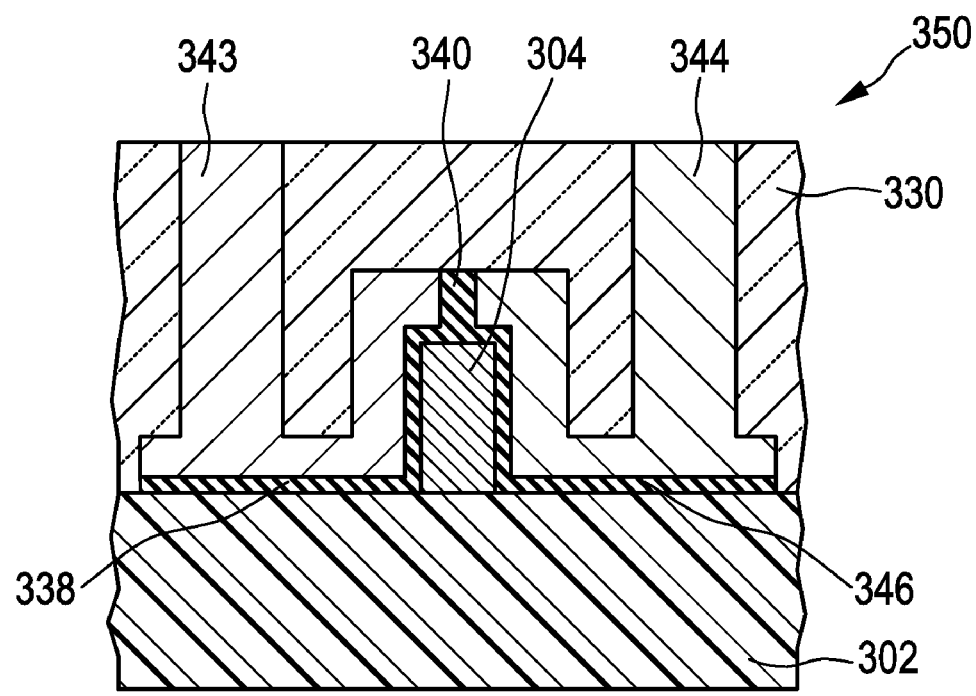
FIG. 11 is a cross-sectional view of an alternative embodiment of a FinFET according to the invention.

FIG. 11 shows a schematic cross-sectional view of a FinFET 350 according to an alternative embodiment, which is a variant of the FinFET 300. Therefore, identical reference numerals are used for identical structural elements in comparison with the embodiment of FIGS. 5 to 10. The FinFET 350 has two separate gates, a left gate 343 and a right gate 344. The fabrication follows that of the FinFET 300, i.e., the processing described in the context of the FIGS. 5 to 10 is first applied to fabricate the left gate 343. Subsequently, analogous processing is applied to fabricate the right gate 344. It is required that the gate electrodes 343 and 344 are fabricated one after the other in order to allow the fabrication of the gate separation layer 340.

More specifically, the formation of the right gate 344 follows the described processing steps of forming a contact opening, selectively removing the remaining parts of the first gate layer 310 on the right side of the fin, stopping the removal at the interface to the gate separation layer 340, subsequently selectively removing the remaining parts of the first gate-isolation layer 308 on the right gate side, then depositing a third gate-isolation layer 346 and finally filling the tunnel with a gate electrode-material, as described before with respect to the left gate 343. The planarization treatment is in one processing embodiment performed only once for both gates, namely, after the fabrication of the right gate 344 just described.

The FinFET of the present embodiment has an increased thickness of the gate separation layer 340. It corresponds to the sum of the thicknesses of the second and third gate-isolation layers 338 and 346. If they are chosen equal, the thickness corresponds to approximately twice the thickness of the gate dielectric in the finished FinFET 350.

The provision of two separate gates 343 and 344 allows a dynamic adjustment of the threshold voltage of the FinFET. The FinFET of the invention can be fabricated easily with a desired asymmetry in the gate stacks of the gate electrodes 343 and 344. In one variant, different gate-stack materials are provided on the left and right sides of the fin.

Note that it is also possible to fabricate the gate-isolation layers 338 and 340 with different thickness. This is shown in the embodiment of FIG. 12, which will be described in the following.

Figure 12:
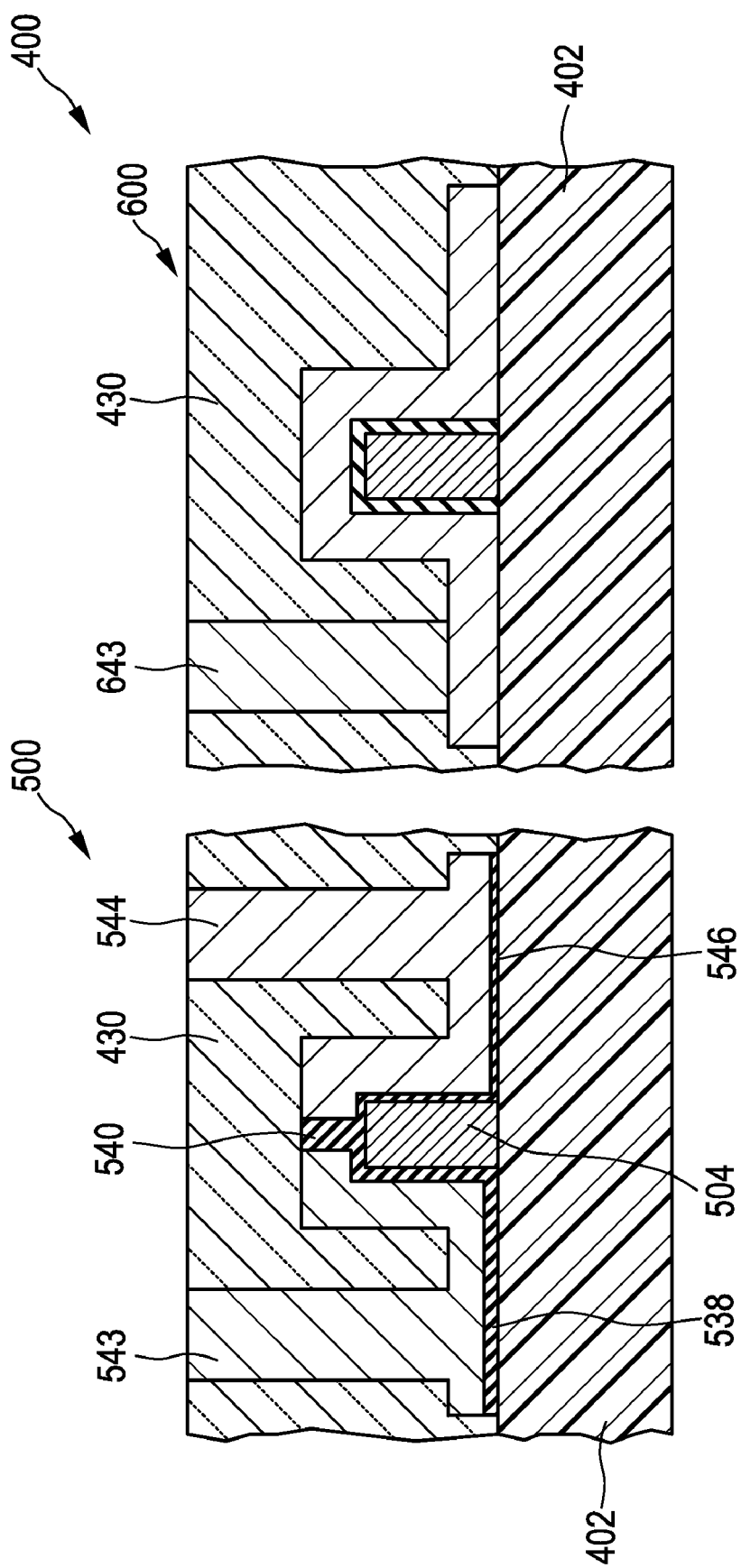
FIG. 12 is a schematic cross-sectional view of a wafer with FinFETs of two different types.

FIG. 12 shows, as a further alternative, a cross-sectional view of an integrated circuit 400 having two types of FinFETs, a FinFET 500 of a first FinFET type having separate gates 543 and 544 and a FinFET 600 of a second FinFET type having a single continuous gate 643.

The FinFET 500 with separate gates 543 and 544 has an asymmetric structure. On the left side of the fin 504, the second gate-isolation layer 538 thickness that is larger than that of the third gate-isolation layer 546 on the right side of the fin 504.

The right gate 544 may for instance serve for low-power switching, while the left gate 543 may be fabricated for high-performance applications.

Of course, the asymmetry can also be provided by a combination of different materials and different thickness on the left and right sides.

To fabricate the integrated circuit 400 of FIG. 12, the FinFETs 500 and 600 of the first and second types, respectively, are fabricated together up to the deposition of the cover layer 430. Then, the processing continues with either a module for the fabrication of the FinFETs 500 of the first type, or with a module for the fabrication of the FinFETs 600 of the second type. After that, the respective other type of FinFET is fabricated, followed by a planarization treatment such as CMP. In each of the FinFET modules, the respective other FinFET structures are protected by suitable measures, such as masking.

The detailed structure of the FinFET 500 of the first type may of course alternatively correspond to that of the previously described other FinFET embodiments with separate gates. If desired, different structures of FinFETs with separate gates according to other embodiments can be fabricated additionally in separate third, fourth, etc. FinFET modules.

One of the advantages of the FinFET structure and of the method for fabricating a FinFET with separate gates according to the present invention is the robustness of the fabrication process. This allows achieving high processing yields.

To illustrate the robustness of the process against misalignments and variations in the processing conditions within a given process window, FIGS. 13 to 20 show different cross-sectional views of variations of the first embodiment of the FinFET 300 (FIGS. 5 to 10) at one particular processing stage. The reference numerals used in these Figures are identical to those of the embodiment of FIGS. 5 to 10.

Figure 13:
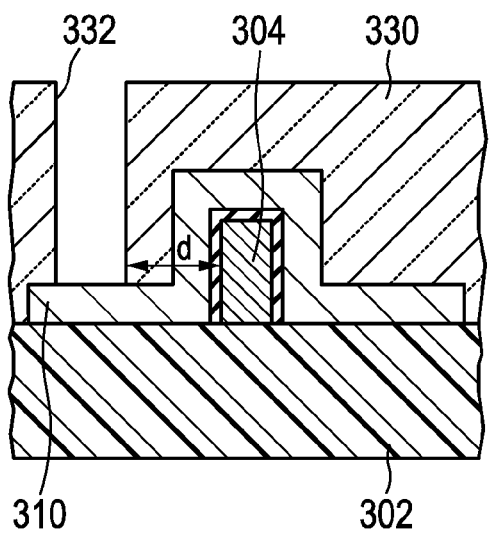
FIGS. 13 to 20 show cross-sectional views of the first embodiment of the FinFET at one particular processing stage for illustrating the robustness of the process of the invention against misalignments and variations in the processing conditions within a process window.
Figure 14:
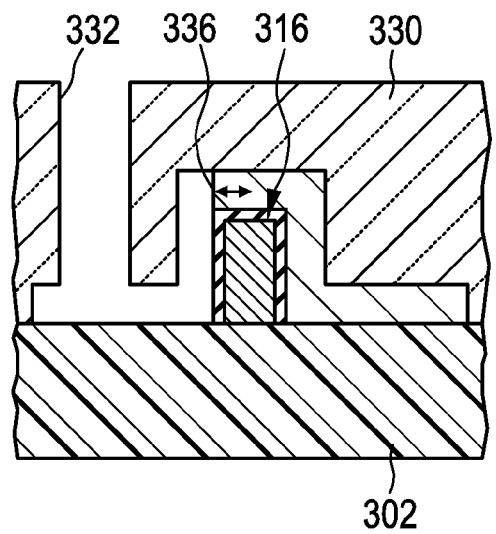

FIGS. 13 and 14 show a first allowable, i.e., fully functional variant of the FinFET 300 in the processing stage of FIG. 7. In this variant, the contact opening 332 is misaligned. A lateral distance d between the fin 304 and the contact opening is larger than a nominal distance value of the contact opening 332, which is provided correctly in the FinFET structure 300 of FIG. 5. As a consequence, as shown, in FIG. 14, the subsequent removal of the first gate layer 310 on the left side of the fin 304 will stop before reaching the center of the top face 316 of the fin.

Figure 15:
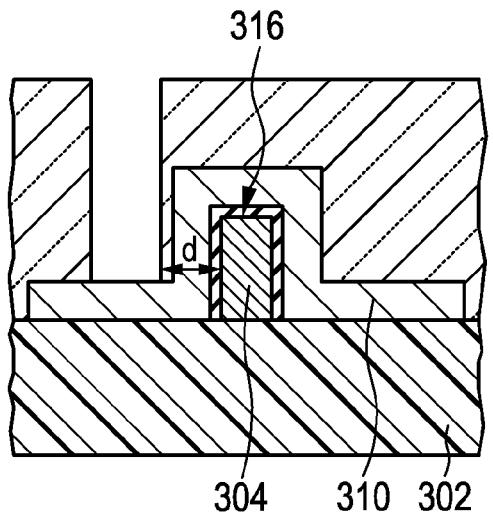
Figure 16:
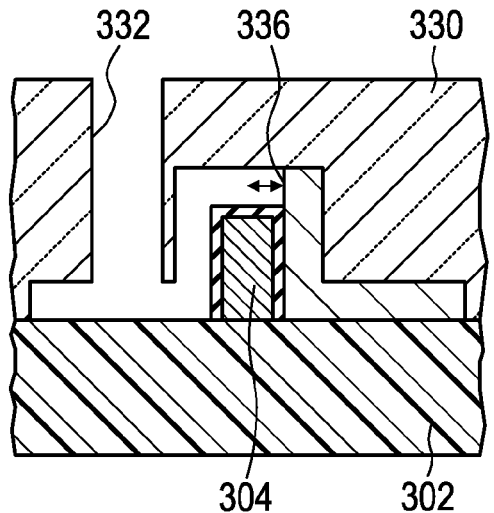

In contrast, FIGS. 15 and 16 show a second allowable variant, in which the contact opening 332 is also misaligned, but in which the lateral distance d between the fin 304 and the contact opening 332 is smaller than the nominal distance value of the contact opening 332 of FIG. 7. As a consequence, as shown, in FIG. 16, the subsequent removal of the first gate layer 310 on the left side of the fin 304 will stop after passing the center of the top face 316 of the fin.

Both cases will result in a placement of the gate separation layer 340 (not shown in these figures) at the respective end face 336 of the remaining parts of the first gate layer 310 away from the center of the top face 316 of the fin 304. However, this does not affect the functionality of the FinFET 300.

Figure 17:
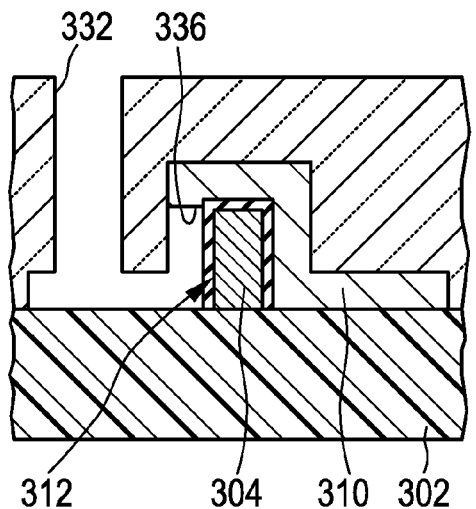
Figure 18:
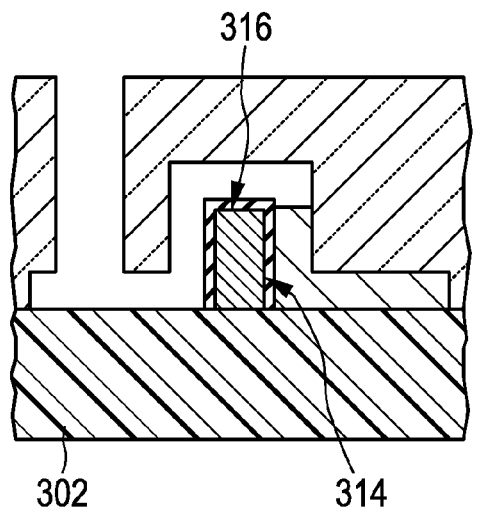

The limits of the allowable process window are represented by the variants of FIGS. 17 and 18. In FIG. 17, the variant of FIG. 14 reaches an extreme in that the removal of the first gate layer already stops at the level of the top face 316 of the fin 304, still on the left side of the fin. The remaining parts of the first gate layer thus cover the full top face 316 of the fin 304 and have an end face 336 that is oriented downwards, i.e., towards the buried oxide layer 302. However, it is important to note that the remaining parts of the first gate layer do not reach the onset of the left fin face. With the gate separation layer deposited on the end face 336 and the further processing as described, a FinFET structure is provided, in which during operation the left channel region in the fin remains unaffected by a control voltage applied to the right gate electrode. The separate gates can thus still be addressed independently.

The other extreme is represented by the variant of FIG. 18, in which the removal of the first gate layer exceeds the lateral extension of the top face 316 of the fin, such that the end face 336 of the remaining parts of the first gate layer is oriented upwards, i.e., away from the oxide layer 302. However, the end face 336 of the first gate layer does not reach the onset of the right fin face. With the gate separation layer deposited on the end face 336 and the further processing as described, a FinFET structure is provided, in which during operation the right channel region in the fin 304 remains unaffected by a control voltage applied to the left gate electrode. The separate gates can thus still be addressed independently in the present variant.

Figure 19:
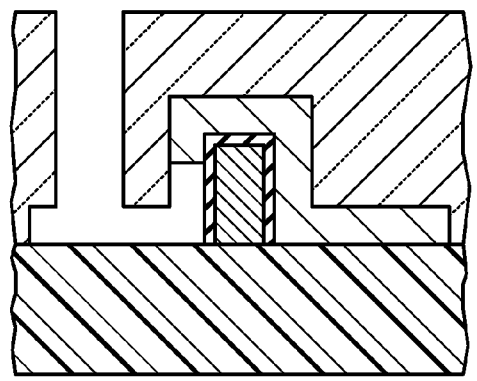
Figure 20:
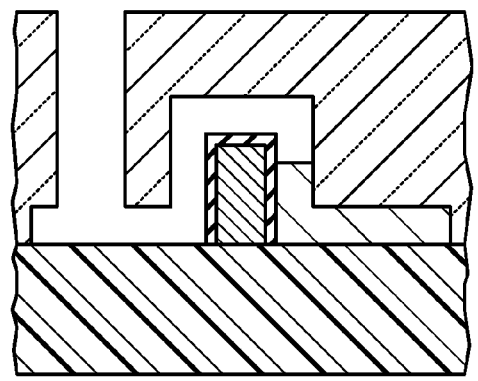

Unallowable variants of the removal of the first gate layer are represented by the FinFET structures of FIGS. 19 and 20. In these structures, after finishing the FinFET, the left and right channel regions of the fin cannot be controlled independently.

Variations in the removal depth of the first gate layer may not only be caused by a misalignment of the contact opening, which is used for access of the etching agent. Other possible causes are for instance parameter variations the etching step, such as in the duration of the application of the etching agent, in the composition of the etching agent, and in the process temperature.

Figure 21:
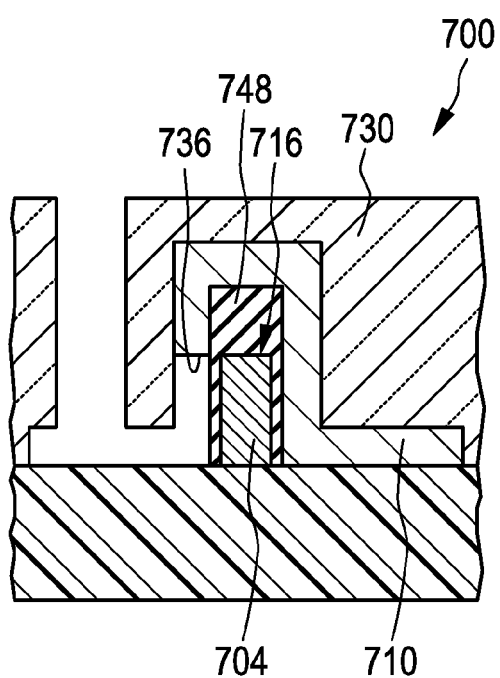
FIGS. 21 and 22 show cross-sectional views of another alternative embodiment of a FinFET at one particular stage of its fabrication for illustrating the robustness against misalignments and variations in the processing conditions within a process window.
Figure 22:
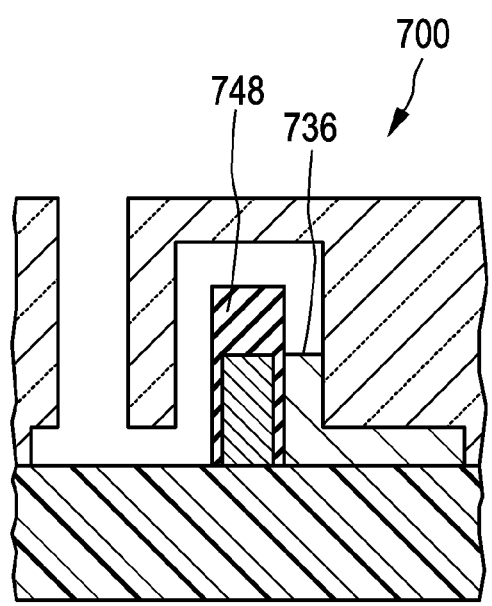

FIGS. 21 and 22 show allowable variants of an alternative embodiment of a FinFET 700 in a processing stage corresponding to that of FIG. 7. The FinFET 700 differs from the previously described embodiments in that hard-mask layer in the form of a dielectric cap 748 is located on the top face 716 of the fin 704. While a positioning of the gate separation layer in the center of the top face corresponds to the nominal process conditions here as well, this variant provides an even larger process window for the removal of the first gate layer 710 on the left side of the fin 704.

In typical technology nodes applied today the previous embodiments provided an allowable process window of approximately 20 nm for variations in the location of the end face 336. The dielectric cap 748 of the variant of FIGS. 21 and 22 can increase the allowable variations to approximately 100 nm, depending on the thickness of the cap.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

The FinFETs according to this invention can be also manufactured on regular bulk silicon substrates instead of SOI substrates.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method for fabricating a FinFET that has separate gates, comprising:
providing a substrate with a transistor structure that has
a fin-shaped channel region, hereinafter called fin, standing on the substrate surface;
a gate stack, comprising a continuous first gate-isolation layer on mutually opposite lateral fin faces and on a top fin face, and a continuous first gate layer on the gate-isolation layer, the first gate layer continuing into a first contact section that, on a first lateral side with regard to the fin, laterally extends away from the fin on the substrate; and
a cover layer covering the gate stack;
fabricating a first contact opening that extends through the cover layer to the contact section of the first gate layer;
selectively, with respect to at least the cover layer and the substrate, removing through the first contact opening the first gate layer in the contact section and at least on the adjacent lateral face of the fin, stopping the removal before reaching an onset of the opposite lateral fin face, thus forming a first tunnel having an end wall formed by an end face of remaining parts of the first gate layer;
depositing a second gate-isolation layer on the tunnel walls, thus also forming a gate-separation layer on the end wall of the first tunnel and covering the end face of the remaining parts of the first gate layer; and
fabricating a first gate electrode by filling the remaining volume of the first tunnel with electrically conductive material.

2. The method of claim 1, wherein
providing the substrate with a transistor structure comprises providing the gate stack with the first gate layer, which continues into a second contact section that, on a second lateral side with regard to the fin, which is opposite to the first lateral side, laterally extends away from the fin on the substrate; the method further comprising;
fabricating a second contact opening that extends through the cover layer to the second contact section of the first gate layer;
selectively, with respect to at least the cover layer, the substrate and the second gate-isolation layer, removing through the second contact opening the first gate layer in the second contact section and at least on the adjacent lateral face of the fin, stopping the removal with reaching the gate-separation layer, thus forming a second tunnel having an end wall formed by the exposed face of the gate-separation layer;
depositing a third gate-isolation layer at least on side walls of the second tunnel; and
fabricating a second gate electrode, which is isolated from the first gate electrode by the second gate-isolation layer, by filling the second tunnel with electrically conductive material on the third gate isolation layer.

3. The method of claim 1, wherein the removal of the first gate layer is performed selectively also with respect to the first gate-isolation layer, and wherein the first gate-isolation layer is subsequently removed individually in the first or second tunnel, respectively.

4. The method of claim 1, wherein providing the substrate with a transistor structure comprises providing the gate stack with a hard-mask layer on the top face of the fin.

5. The method of claim 1, wherein the first, second or third gate isolation layer is made of a material from the group formed by silicon oxide, silicon oxynitride, hafnium oxide, and zirconium oxide, or is made of at least two of these materials.

6. The method of claim 1, wherein the first gate layer is made of a material selected from the group formed by silicon and silicon-germanium.

7. The method of claim 1, wherein fabricating the first gate electrode comprises filling the tunnel by depositing a second gate layer on the second gate-isolation layer and an electrically conductive filler material on the second gate layer.

8. A method for fabricating an integrated circuit comprising a first type of FinFETs having separate gates and a second type of FinFETs having a single continuous gate, the method comprising performing the method of claim 1 selectively for those transistor structures on the substrate, which are provided for fabrication of FinFETs of the first type.

9. The method of claim 8, comprising, after the providing step, protecting those transistor structures provided for fabrication of FinFETSs of the second type so as to keep them unaffected by the process flow of the method either for the complete process flow or beginning at the latest with the selective removal of the first contact opening and ending at the earliest with the completion of the deposition of the second gate-isolation layer.

* * * * *